(12) United States Patent
Hand et al.

(10) Patent No.: US 8,093,609 B2
(45) Date of Patent: Jan. 10, 2012

(54) LIGHT EMITTING DIODE ARRANGEMENT FOR HIGH SAFETY REQUIREMENTS

(75) Inventors: Mark Anthony Hand, Covington, GA (US); Daniel Sekowski, Lafayette, IN (US); Frederick Lloyd Carpenter, Conyers, GA (US); Bernhard Bachl, Regensburg (DE); Bernd Bienek, Oberhausen (DE); Olaf Cladders, Kamp-Lintfort (DE); Henning Dieker, Meerbusch (DE); Christian Miesner, Toenisvorst (DE); Peter Schöpper, Sonsbeck (DE); Lothar Schopmann, Kamp-Lintfort (DE); Herfried Zimmer, Oberhausen (DE)

(73) Assignee: ABL IP Holding LLC, Conyers, GA (US)

( * ) Notice: Subject to any disclaimer, the term of this patent is extended or adjusted under 35 U.S.C. 154(b) by 248 days.

(21) Appl. No.: 12/434,242

(22) Filed: May 1, 2009

(65) Prior Publication Data

US 2010/0276711 A1 Nov. 4, 2010

(51) Int. Cl.
*H01L 33/00* (2010.01)

(52) U.S. Cl. ................ 257/98; 257/79; 257/99
(58) Field of Classification Search .......... 257/79, 257/98, 99, E33.058, E33.066
See application file for complete search history.

(56) References Cited

U.S. PATENT DOCUMENTS

| 7,094,459 B2 * | 8/2006 | Takahashi ............ 428/68 |
| 2003/0167666 A1 * | 9/2003 | Close, Jr. ............ 40/452 |
| 2008/0061314 A1 * | 3/2008 | Liaw et al. ........... 257/99 |

* cited by examiner

*Primary Examiner* — Phuc Dang
(74) *Attorney, Agent, or Firm* — Kilpatrick Townsend & Stockton LLP

(57) ABSTRACT

In a light emitting diode arrangement for lighting purposes, comprising a circuit board with at least one light generating semiconductor element disposed on the circuit board and conductors extending on the circuit board to the semiconductor element and being electrically connected to terminals of the semiconductor element, a light transmissive element is disposed on the circuit board and covers the semiconductor element and a flame resistant cover element is disposed below the light transmissive element and on top of the terminals to cover the terminals to provide for electrical and flame insulation thereof.

17 Claims, 2 Drawing Sheets

LIGHT EMITTING DIODE ARRANGEMENT FOR HIGH SAFETY REQUIREMENTS

BACKGROUND OF THE INVENTION

The present invention resides in a light emitting diode arrangement for lighting purposes.

For the lighting of rooms and for outdoor lighting, increasingly light emitting diodes are used in arrangements in which generally a plurality of light emitting diodes is combined in light emitting diode arrangements.

Such a light emitting diode arrangement is disclosed for example in DE 10 2006 048 230 A1. The light emitting diode arrangement disclosed in this patent publication comprises a circuit board arranged in direct contact with a heatsink for dissipating waste heat. For covering the light emitting diode and the circuit board, a transparent cover is used whose edges are attached to the heatsink. The cover includes a projection which is directed toward the light emitting diode and which includes a recess into which the light emitting diode extends.

If a light emitting diode module includes a plurality of light emitting diodes in order to generate a high light output, the light emitting diodes are preferably connected in a series arrangement. Power is supplied to the light emitting diode series circuit by way of a corresponding electronic power supply circuit from a suitable power supply such as a public power distribution system.

If the power supply for the light emitting diodes has a voltage of less than 50 V, there is no problem with the electrical safety at the light emitting diodes. The trend however is to use higher light emitting diode power supply voltages in order to limit the conversion losses in the electric power supply circuits. As a result however, voltages of for example about 400 V may occur in such power supply circuits of serial light emitting diode arrangements such that a highly reliable electric insulation of the light emitting diode module is required. The high electrical safety should also be maintained for example in case of a fire.

It is therefore the principal object of the present invention to provide an improved light emitting diode arrangement which can be used for lighting purposes even if high safety requirements are to be observed.

SUMMARY OF THE INVENTION

In a light emitting diode arrangement for lighting purposes, comprising a circuit board with at least one light generating semiconductor element disposed on the circuit board and traces extending on the circuit board to the semiconductor element and being electrically connected to terminals of the semiconductor element, a light-transmissive element is disposed on the circuit board and covers the semiconductor element and a flame resistant cover element is disposed below the light-transmissive element and on top of the terminals to cover the terminals and provide for electrical insulation thereof.

The circuit traces are disposed preferably at the front side of the circuit board where also the semiconductor element is arranged. The number of semiconductor elements is determined depending on the application purpose. For some applications, a single semiconductor element may be sufficient. However, generally the circuit board carries a group of semiconductor elements which are arranged in an electric series circuit. The semiconductor elements are connected to the energized power traces.

For the emission of light at least one light-transmissive element for example in the form of a transparent cover plate is arranged on top of the basic carrier. In a preferred embodiment, the light-transmissive element including a lens consisting preferably of plastic is arranged over each semiconductor element. The light-transmissive element is attached to the semiconductor element or to the circuit board.

The terminal locations are arranged at the side of the semiconductor element where the terminals of the semiconductors are electrically connected to the power traces for example by weld or solder joints. They have a thickness which is greater than the thickness of the power traces. The joints are preferably covered by a flame resistant cover element which is firmly connected to the light emitting diode arrangement. Independently of the thickness of an encapsulating layer carrying, on its top side, the flame resistant cover element remains in place and prevents electrical contact with the light emitting diode arrangement or the encapsulating layer even when the entire unit is partially destroyed by fire and the plastic lenses are already partially melted down, for example. Also, in the case of an electrical power surge or a manufacturing defect, which would induce electrical arcing across and between the terminals of the semiconductor element, the flame resistant cover element would prevent flames igniting the plastic lens over the semiconductor element. The flame resistant cover element may be a flat plate-like or strip-like ceramic element which extends along at least one side of the semiconductor element. Preferably, the cover element is in the form of a flat frame with a center cut-out which is slightly larger than the semiconductor element. The ceramic frame can, as a result, be arranged around the semiconductor element.

Preferably, the ceramic element consists of an electrically insulating ceramic material, in particular an oxidic ceramic material. Expediently, it is held in position over the connecting areas wherein the plastic material extends between the terminals of the semiconductor element and forms the connection between the cover element and the circuit board. As plastic material expediently a durably elastic plastic material is used, preferably a silicon plastic.

For the generation of light, the semiconductor element may have one or several pn-transitions each of which can be considered as being a light emitting diode. Furthermore, the semiconductor element may include several light generating chips in a single housing.

In a preferred embodiment, the light emitting diode arrangement comprises several identically formed semiconductor elements all of which generate light essentially in the same spectral range. It may be light in the visible range for example white light. It is also possible to generate short-wave light, for example blue light which is converted partially to light of a longer wavelength by a conversion element connected to, or arranged on top of, the semiconductor element, in order to provide a mixed light which causes a certain desired, for example, white light impression. The semiconductor elements may also generate UV light which is converted by the conversion element, that is, a corresponding luminescent material, into visible light. Further, the light emitting diode arrangement may include several semiconductor elements with several light sources of different colors combined in a housing so that a white light impression is generated. Furthermore, several semiconductor elements may be provided on a common circuit board wherein the semiconductor elements generate light of different colors which, when mixed, become white light.

The invention will become more readily apparent from the following description of various embodiments of the invention on the basis of the accompanying drawings which show particular aspects of the invention.

DESCRIPTION OF PARTICULAR EMBODIMENTS

Figure 1:
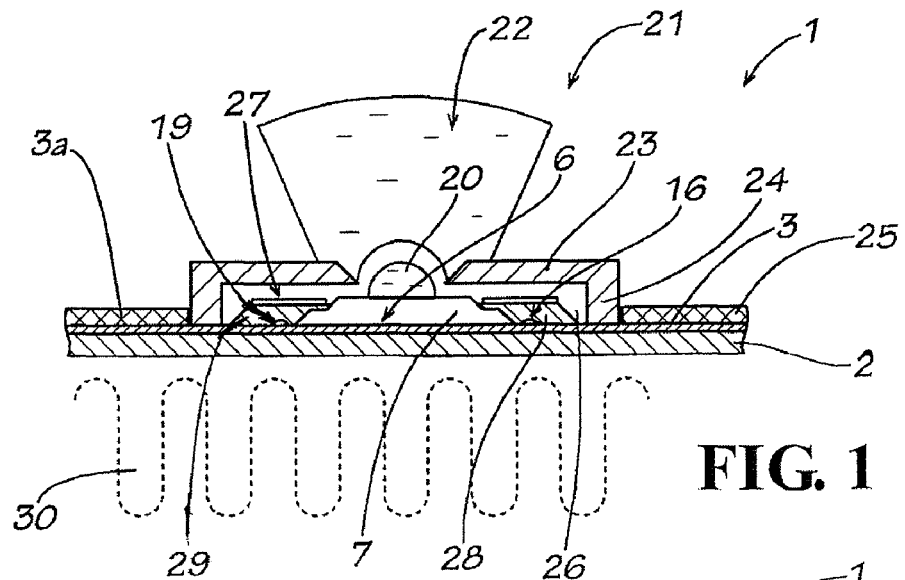
FIG. 1 shows the light emitting diode arrangement according to the invention in a partial cross-sectional view.

FIG. 1 shows a light emitting diode arrangement 1 adapted to serve lighting purposes. The light emitting diode arrangement 1 comprises a preferably plate-like circuit board 2 which may be formed for example by a printed circuit board. The printed circuit board may be an electrically insulating plastic body as shown in FIG. 1 which carries on its upper front side conductors 3, 4, 5 (FIG. 2) for supplying electric power to the semiconductor element 6. The circuit board 2 may alternatively by a metal plate for example an aluminum plate which is provided at its top with an electrically insulating layer, for example of aluminum oxide on which the conductor strips 3, 4, 5 may be disposed.

The semiconductor element 6 includes at least one semiconductor with a light emitting area, for example, a light emitting diode. The semiconductor element 6 may be formed by a naked chip. In the present embodiment, however, it comprises a plastic housing 7, which has at least at one, or as shown, at two different sides, terminals 8, 9, 10, 11, 12 13. The number of terminals 8-13 depends on the electrical requirements and may expediently vary in connection with different embodiments. The connections 8-13 may be provided at one side of the housing 7 or different sides of the housing 7 for example on opposite sides. Preferably, they have all essentially the same length so that, in each case, the connecting areas are arranged in a row and provide connecting areas 14, 15, 16 to the conductors 3, 4, 5 which are all arranged in a line. Corresponding connector locations 17, 18, 19 are then provided for the terminals 11, 12, 13.

The connecting areas 14-19 may be solder connections where the terminals 8-13 are connected to the conductors 3, 4, 5 (3a, 4a, 5a). As shown in FIG. 1, the connecting areas 14-19 are raised projections extending above the conductors 3, 4, 5. This is indicated in FIG. 1 as an example for connecting areas 16 and 19.

The semiconductor element 6 includes at its front side a light emission window 20 which extends from the front side of the circuit board 2 and which may be curved as shown. Above the light emission window 20, there is a light-transmissive element 21 which in the embodiment shown is a lens 22. By means of the lens, a predetermined light distribution can be achieved. The lens 22 or another light-transmissive element 21 is firmly retained on the circuit board 2. To this end, a socket 23 is provided which extends over the semiconductor element 6 and the associated connecting areas 14 to 19. Its outer edge 24 is disposed on the circuit board 2 and may be bonded thereto. The socket 23 may consist of plastic material. It may consist of an opaque material and may be firmly connected to the lens 22 so as to from one piece. Alternatively, the socket 23 may consist of the same material as the lens 22 and it may even be formed integrally therewith.

The circuit board 2 is provided at its front side with a layer 25 consisting of an encapsulating material, for example, an epoxy resin which becomes firmly attached to the circuit board and the socket edge 24. In this way, the layer 25 hermetically seals the socket 23 to the circuit board 2 so that the enclosed inner space 26 is not subjected to any corrosive influences. In addition, under normal conditions, the socket 23 provides for contact protection so that the light emitting diode arrangement can be safely touched during operation.

Figure 2:
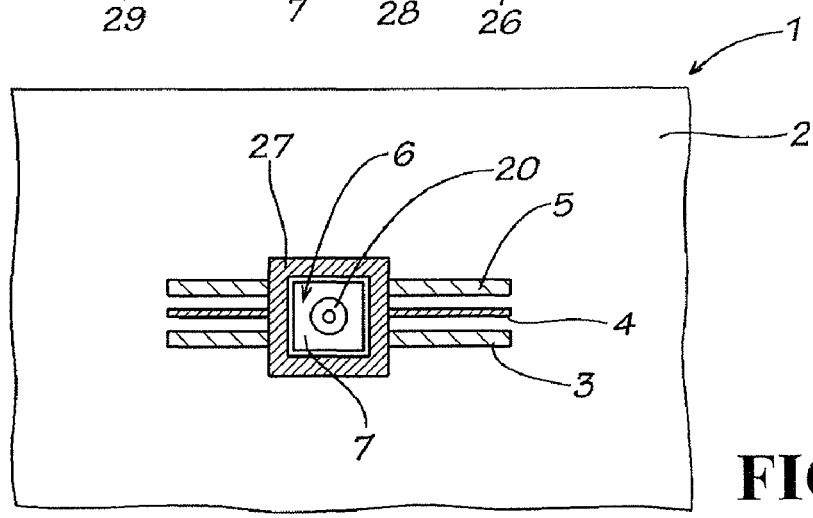
FIG. 2 shows part of a light emitting diode cover in a plane partial view.

For further increasing the safety, the connecting areas 14 to 19 are provided with a cover element 27 which consists preferably of a flame resistant ceramic material with little heat conductivity. As shown in FIG. 2, the cover element 27 is a flat plate provided with a central opening so that it forms a frame structure. The central opening of the cover element 27 is adapted to the contour of the housing 7 of the semiconductor element 6. In this way, the frame formed by the cover element 27 extends in particular over the areas above the terminals. As shown in FIG. 2 it may be a one-part structure extending all around the housing 7. But it may also consist of parts which are joined at the corners or the edges and be formed from two or more elements.

The cover element 27 is preferably bonded onto the connecting areas 14 to 19 and the circuit board 2. For this purpose, plastic material 28, 29 is accumulated on the connecting areas 14-19 as shown in FIG. 3.

Figure 3:
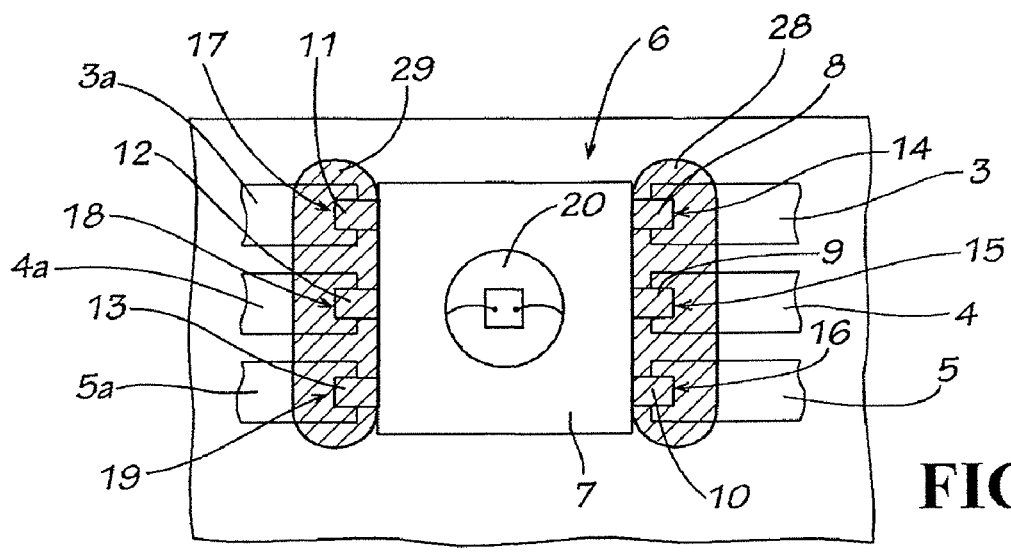
FIG. 3 shows the light emitting diode arrangement according to FIG. 2 without carrier element at a reduced scale.

FIG. 3 represents an intermediate step in the manufacture of the arrangement wherein the connecting areas are covered with deposits of plastic material. The material accumulations formed by the plastic material deposits 28 extend along the sides of the housing 7 and consist for example of a plastic which has not been cured yet. Onto the accumulated plastic material, the frame-like cover element 27 is placed so that it is adhered to the plastic material and is firmly held in position after the curing of the plastic material. Preferably, the plastic material is a cross-linked silicon rubber which has no thermoplastic properties and therefore fulfills its retaining function also when subjected to high temperatures.

The embodiment of the light emitting diode arrangement 1 as described provides for improved electric safety. The conductors (3, 4, 5, 3', 4', 5') extending outside the socket 3 are protected from being contacted by a sufficiently thick layer 25 of electrically insulating encapsulating material. During a fire, external to the light emitting device, it may happen however that the lenses and possibly also the socket 23 may melt and expose the light emitting diode. Even in this event however, the electric safety is maintained. The ceramic cover element 27 covers the connecting parts 14-19 which may carry an even higher voltage of for example up to 400 volts.

Figure 4:
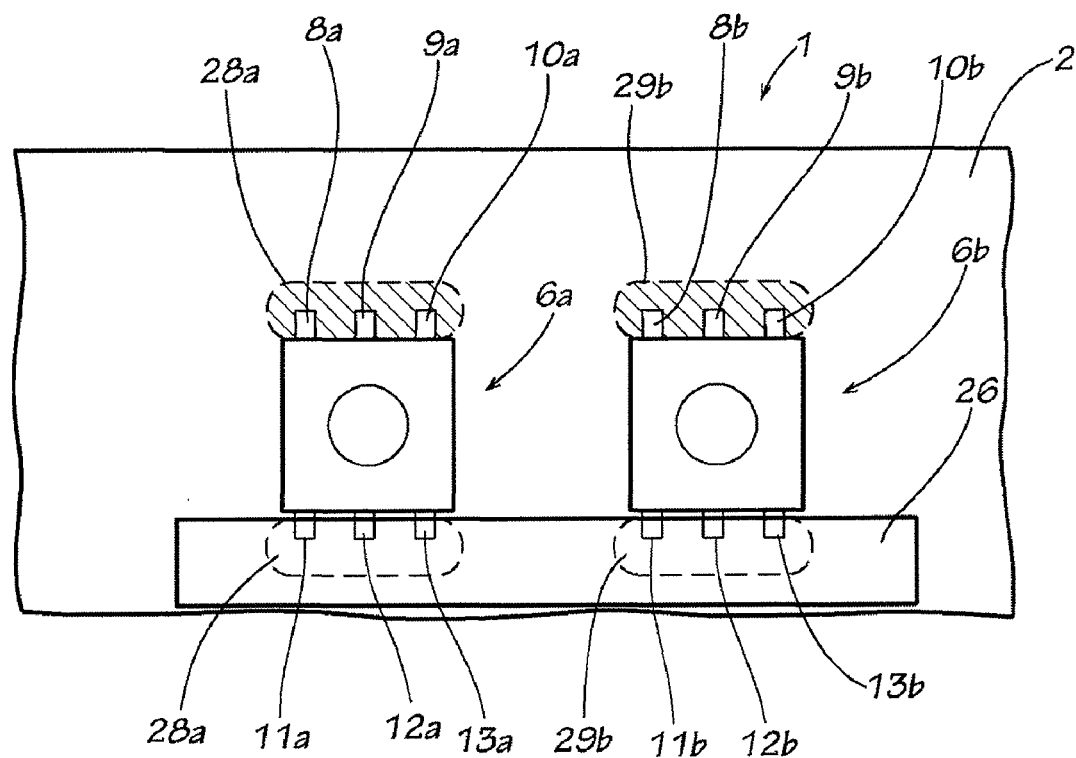
FIG. 4 shows in a plane partial view a modified embodiment of a light emitting diode arrangement with an elongated cover element.

FIG. 4 shows a slightly modified embodiment of the light emitting diode arrangement according to the invention. The semiconductor elements 6a, 6b again are provided with terminals 8a to 13a and 8b to 13b. In the upper part of FIG. 4, the plastic material deposits 28a, 28b are shown which are applied to the terminals 8a-10a and 8b-10b. At the bottom end of FIG. 4, the plastic material deposits 29a, 29b are shown on which the cover element 27 is already disposed. The same strip-like cover element is also placed onto the plastic deposit 28a, 28b.

If then the layer 25 described earlier is applied to the circuit board 2, it can be applied as a relatively thin layer. The electrical insulation and the fire resistant cover of the energized terminals 8a-13b does not depend on the layer 25 which may be of insufficient thickness for that purpose, but on the cover elements 27. The light emitting diode arrangement according to FIG. 4 may, as described earlier, be provided with individual lenses or with a cover plate consisting for example of plastic material which extends over the circuit board 2 and essentially completely covers it. If it is removed as a result of heat, mechanical causes or other destructive influences it is still safe to contact the light emitting diode arrangement 1.

Figure 5:
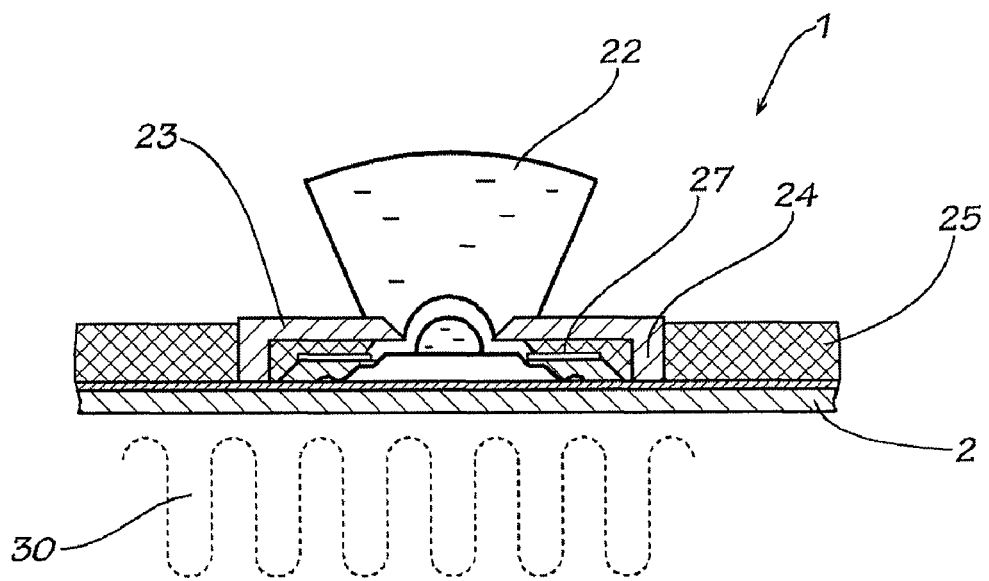
FIG. 5 shows a light emitting diode arrangement similar to FIG. 1 with a thick coating cover in a partial sectional view.

FIG. 5 shows another embodiment of the light emitting diode arrangement to which the description of the light emitting diode arrangement according to FIG. 1 also applies. However, it is different from the arrangement of FIG. 1 in that the layer 25 is thicker. In addition the socket edge 24 may have at least one and preferably several cut-outs so that the casting material of the layer 25 can enter the inner space 26. Again however, the cover element 27 continues to provide for safe electrical insulation even if the lens 22 and/or the socket 23 are removed. Different from the earlier description the socket 23 may also be constructed of a ceramic material and is thus capable of taking over the function of the cover element 27. In this case, the socket 23 replaces the cover element.

As indicated in FIGS. 1 and 5 by dashed lines, the light emitting diode arrangement 1 of all embodiments can be provided, if needed, with a heatsink 30 which is in contact with the backside of the circuit board 2 for removing heat therefrom.

The light emitting diode arrangement according to the invention comprises a circuit board 2 supporting light generating semiconductor elements 6 such as light emitting diodes. The terminals 8-13 of the semiconductor elements 6 are connected to conductors 3, 4, 5 by soldering to establish electrical contacts. The front side of the circuit board 2 supporting the respective traces and semiconductor elements is provided with an electric insulating layer 25 to provide for electrical insulation. This layer may be relatively thin. It may or may not sufficiently cover the terminals of the semiconductor elements 6. The terminals of the semiconductor elements 6 however are covered toward the user by one or several cover elements constructed preferably of a ceramic material. Such a cover element 27 is attached at the terminals of the semiconductor elements 6 and the circuit board 2 attached on the underside by a suitable, preferably not thermo-elastic, plastic.

With such an arrangement, a very high electric safety can be achieved in spite of a very thin layer 25. The thickness of the layer 25 may be less than 3 mm. Furthermore, additional optical elements such as lenses 22 can be arranged in close proximity with the semiconductor element 6 which permits the design of light emitting diode arrangements of relatively small dimensions and high light output.

| Listing of Reference Numerals | |
|---|---|
| 1 | Light emitting diode arrangement |
| 2 | Circuit board |
| 3, 4, 5 | Conductors |
| 6 | Semiconductor element |
| 7 | Housing |
| 8-13 | Terminals |
| 14-19 | Connecting areas |
| 20 | Light emission window |
| 21 | Light-transmissive element |
| 22 | Lens |
| 23 | Socket |
| 24 | Edge of socket |
| 25 | Layer |
| 26 | Inner space |
| 27 | Cover element |
| 28, 29 | Plastic material deposits |
| 30 | Heatsink |

We claim:

1. A light emitting diode for lighting purposes, comprising:
a circuit board;
at least one semiconductor element for generating light disposed on the circuit board, the semiconductor element including at least one terminal for supplying electrical energy to the semiconductor element;
at least one conductor extending on the circuit board to the at least one semiconductor element and being electrically connected to the at least one terminal at an least one connecting area;
a light-transmissive element supported on the circuit board covering the at least one semiconductor element and at least one flame resistant cover element disposed below the light-transmissive element and on top of the at least one terminal for covering the at least one terminal.

2. The light emitting diode of claim 1, wherein the circuit board comprises a printed circuit board.

3. The light emitting diode of claim 2, wherein the printed circuit board includes a base plate formed of a metal and the base plate has at least at one side with an electrically insulating layer for supporting the at least one conductor.

4. The light emitting diode of claim 1, wherein the at least one terminal is soldered to the at least one conductor.

5. The light emitting diode of claim 1, wherein the at least one terminal is welded to the at least one conductor.

6. The light emitting diode of claim 1, the at least one semiconductor element including a plastic housing having a light emission window which is positioned at a side of the housing opposite the circuit board.

7. The light emitting diode of claim 6, wherein the at least one terminal within the at least one connecting area is positioned along at least one side of the housing and projects therefrom.

8. The light emitting diode of claim 1, the at least one connecting area including an electrically insulating plastic material deposit.

9. The light emitting diode of claim 8, the plastic material deposit is formed of a permanently elastic plastic material.

10. The light emitting diode of claim 8, the plastic material deposit comprising a silicon plastic material.

11. The light emitting diode of claim 8, the plastic material deposit comprising a polyurethane plastic material.

12. The light emitting diode of claim 8, wherein the at least one cover element adheres to the plastic material deposit.

13. The light emitting diode of claim 1, the at least one cover element comprising a ceramic material.

14. The light emitting diode of claim 1, the at least one cover element comprising a ceramic oxide material.

15. The light emitting diode of claim 1, wherein the at least one cover element is formed as a flat strip which extends along at least one side of the semiconductor element.

16. The light emitting diode of claim 1, wherein the at least one cover element is formed as a frame which surrounds the at least one semiconductor element.

17. The light emitting diode of claim 1, the light emitting diode comprising a lens which extends over the semiconductor element and over the at least one cover element, the cover element affixing the lens to the circuit board.

* * * * *